(12) United States Patent
Zhang

(10) Patent No.: US 11,626,147 B2
(45) Date of Patent: Apr. 11, 2023

(54) TRANSMISSION CIRCUIT, TRANSMISSION METHOD, STORAGE APPARATUS, AND STORAGE MEDIUM

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 39 days.

(21) Appl. No.: 17/467,214

(22) Filed: Sep. 5, 2021

(65) Prior Publication Data

US 2022/0310141 A1    Sep. 29, 2022

Related U.S. Application Data

(63) Continuation of application No. PCT/CN2021/108584, filed on Jul. 27, 2021.

(30) Foreign Application Priority Data

Mar. 26, 2021 (CN) .......................... 202110326655.8

(51) Int. Cl.
*G11C 7/10* (2006.01)
*H03K 19/20* (2006.01)

(52) U.S. Cl.
CPC .......... *G11C 7/1084* (2013.01); *G11C 7/1057* (2013.01); *H03K 19/20* (2013.01)

(58) Field of Classification Search
CPC ..... G11C 7/1084; G11C 7/1057; H03K 19/20
USPC ........................................ 365/189.05
See application file for complete search history.

(56) References Cited

U.S. PATENT DOCUMENTS

2002/0059488 A1  5/2002 Ishida et al.
2018/0277204 A1* 9/2018 Takada ............... G11C 13/0033

FOREIGN PATENT DOCUMENTS

| CN | 1487528 A | 4/2004 |
| CN | 1797381 A | 7/2006 |
| CN | 101492943 A | 8/2009 |
| CN | 107767910 A | 3/2018 |

* cited by examiner

*Primary Examiner* — Huan Hoang
(74) *Attorney, Agent, or Firm* — Kilpatrick Townsend & Stockton LLP

(57) ABSTRACT

Embodiments relate to a transmission circuit, a transmission method, a storage apparatus, and a storage medium. The transmission circuit includes a comparison module and a data conversion module. The comparison module is configured to receive first data on a first data line and second data on a second data line, and compare the first data with the second data to output a comparison result indicating whether number of different bits between the first data and the second data exceeds a preset threshold, wherein the first data and the second data have the same preset bit width. The data conversion module is electrically connected to the first data line, the comparison module and the second data line, and is configured to invert the first data and transmit the inverted first data to the second data line when the comparison result is indicative of exceeding the preset threshold.

20 Claims, 10 Drawing Sheets

TRANSMISSION CIRCUIT, TRANSMISSION METHOD, STORAGE APPARATUS, AND STORAGE MEDIUM

CROSS-REFERENCE TO RELATED APPLICATION

This application is a continuation of PCT/CN2021/108584, filed on Jul. 27, 2021, which claims priority to Chinese Patent Application No. 202110326655.8 titled "TRANSMISSION CIRCUIT, TRANSMISSION METHOD, STORAGE APPARATUS, AND STORAGE MEDIUM" and filed on Mar. 26, 2021, the entire contents of which are incorporated herein by reference.

TECHNICAL FIELD

The present disclosure relates to the field of semiconductor storage technologies, and more particularly, to a transmission circuit, a transmission method, a storage apparatus, and a storage medium.

BACKGROUND

A semiconductor storage apparatus generally includes a storage array region and a peripheral circuit region, wherein the storage array region is provided with a memory cell array comprising a plurality of memory cells. The peripheral circuit region is provided with a control circuit configured to control read and write.

With the rapid development of semiconductor technologies, the market has higher and higher requirements for storage capacity and power-saving performance of the semiconductor storage apparatus, which puts forward higher requirements for the power-saving performance of the peripheral circuit region and the storage array region in the semiconductor storage apparatus.

However, increase in density and number of memory cells in the memory cell array may lead to increase in length of a data transmission path in the storage array region, resulting in an increasing proportion of power consumption of the data transmission path accounting for power consumption of the semiconductor storage apparatus. How to effectively reduce the power consumption of the data transmission path in the storage array region has become one of technical problems to be solved urgently in the process of further improving the storage capacity and the power-saving performance of the semiconductor storage apparatus.

SUMMARY

A first aspect of the present disclosure provides a transmission circuit, which includes a comparison module and a data conversion module. The comparison module is configured to receive first data on a first data line and second data on a second data line, and compare the first data with the second data to output a comparison result indicating whether number of different bits between the first data and the second data exceeds a preset threshold, wherein the first data and the second data have the same preset bit width. The data conversion module is electrically connected to the first data line, the comparison module and the second data line, and is configured to invert the first data and transmit the inverted first data to the second data line when the comparison result is indicative of exceeding the preset threshold. The data conversion module is further configured to transmit the first data to the second data line when the comparison result is indicative of not exceeding the preset threshold.

A second aspect of the present disclosure provides a storage apparatus, comprising the above-mentioned transmission circuit configured to store and transmit data of a read operation or a write operation.

A third aspect of the present disclosure provides a transmission method, comprising: receiving first data on a first data line and second data on a second data line; comparing the first data with the second data, to output a comparison result indicating whether number of different bits between the first data and the second data exceeds a preset threshold, wherein the first data and the second data have a same preset bit width; and inverting the first data and transmitting the inverted first data to the second data line when the comparison result is indicative of exceeding the preset threshold; or transmitting the first data to the second data line when the comparison result is indicative of not exceeding the preset threshold.

A fourth aspect of the present disclosure provides a computer-readable storage medium, storing a computer program thereon. The computer program is executable by a processor, whereby the above transmission method is implemented.

Details of each embodiment of the present disclosure will be described in the following drawings and descriptions. Based on the specification, drawings and claims, those skilled in the art will easily understand other features, problems to be solved, and technical effects of the present disclosure.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. Additional details or examples for describing the accompanying drawings should not be considered as limitations on scopes of any of the present disclosure, the currently described embodiments or implementations.

FIG. 3b is a schematic diagram of an implementation of FIG. 3a;

FIG. 10b is a schematic diagram of an implementation of FIG. 10a;

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. In addition, certain terms used throughout the specification and the following claims refer to particular components. Those skilled in the art will understand that manufacturers may represent components with different names. This document does not intend to distinguish between components with different names but the same functions. In the following description and embodiments, the terms "including" and "comprising" are used in an open-ended fashion, and thus should be interpreted as "including, but not limited to . . . ". Likewise, the term "connection" is intended to express an indirect or direct electrical connection. Correspondingly, if one device is connected to another device, the connection between the two devices may be achieved by means of a direct electrical connection, or by means of an indirect electrical connection of other devices and connectors.

It should be understood that although terms such as "first", "second" and the like may be used herein to describe various components, these components should not be limited by these terms. These terms are only intended to distinguish one component from another one. For example, a first component may be termed a second component, and similarly, a second component may be termed a first component, without departing from the scope of the present disclosure.

Figure 1:
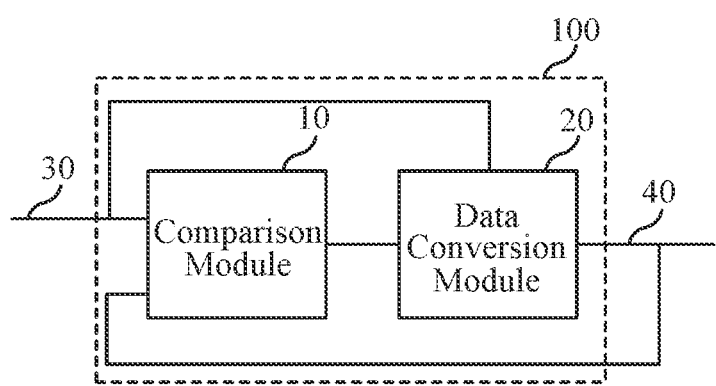
FIG. 1 is a schematic diagram showing a circuit principle of a transmission circuit according to a first embodiment of the present disclosure.

With reference to FIG. 1, in one embodiment of the present disclosure, there is provided a transmission circuit 100, which includes a comparison module 10 and a data conversion module 20. The comparison module 10 is configured to receive first data on a first data line 30 and second data on a second data line 40, and compare the first data with the second data to output a comparison result indicating whether number of different bits between the first data and the second data exceeds a preset threshold, wherein the first data and the second data have the same preset bit width. The data conversion module 20 is electrically connected to the first data line 30, the comparison module 10 and the second data line 40, and is configured to invert the first data and transmit the inverted first data to the second data line 40 when the comparison result is indicative of exceeding the preset threshold. The data conversion module 20 is further configured to transmit the first data to the second data line 40 when the comparison result is indicative of not exceeding the preset threshold. For example, the preset threshold may be half of the preset bit width. The data conversion module 20 is configured to invert the first data and transmit the inverted first data to the second data line 40 when the comparison result is indicative of exceeding the preset threshold. The data conversion module 20 is also configured to transmit the first data to the second data line 40 when the comparison result is indicative of not exceeding the preset threshold, such that number of data inversions is reduced while ensuring a data transmission accuracy, to effectively reduce power consumption in a data transmission process. In this way, the power consumption of a data transmission path in a storage array region can be effectively reduced while ensuring density and number of memory cells in a memory cell array.

Figure 2:
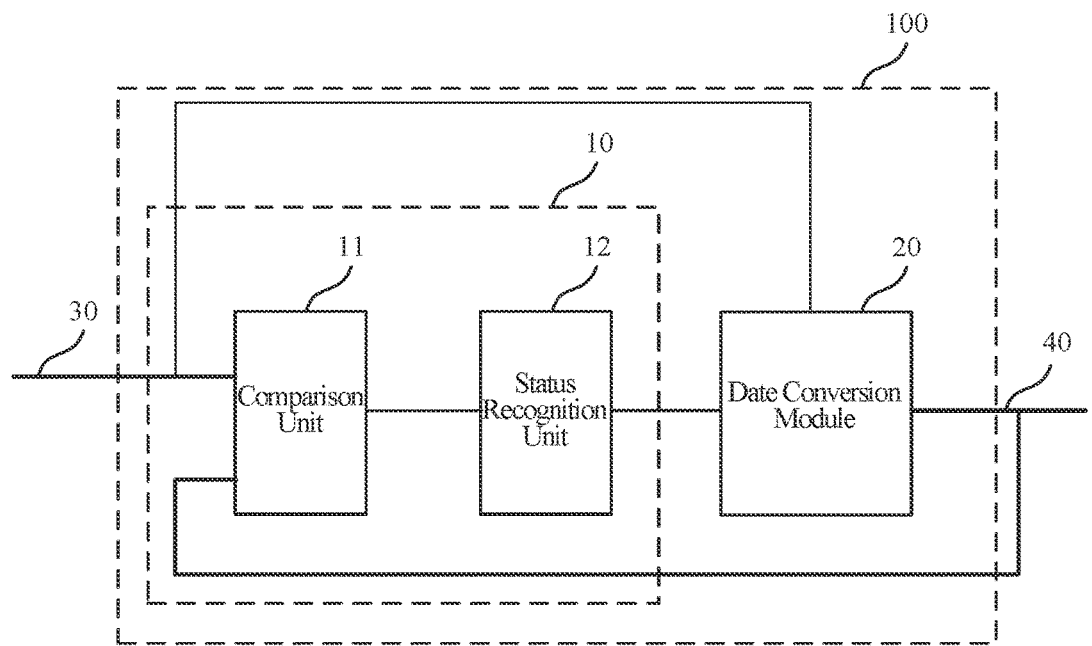
FIG. 2 is a schematic diagram showing a circuit principle of a transmission circuit according to a second embodiment of the present disclosure.

Further, with reference to FIG. 2, in one embodiment of the present disclosure, the comparison module 10 comprises a comparison unit 11 and a status recognition unit 12. The comparison unit 11 is configured to compare the first data and the second data bit by bit, and output comparison status data of each bit. The status recognition unit 12 is electrically connected to the comparison unit 11, and is configured to perform statistics on the comparison status data of each bit, and output the comparison result according to a statistical result, such that the data conversion module 20 inverts the first data and transmits the inverted first data to the second data line 40 when the comparison result is indicative of exceeding the preset threshold, and that the data conversion module 20 transmits the first data to the second data line 40 when the comparison result is indicative of not exceeding the preset threshold. In this way, the number of data inversions can be reduced while ensuring the data transmission accuracy, to effectively reduce the power consumption in the data transmission process.

Figure 3A:
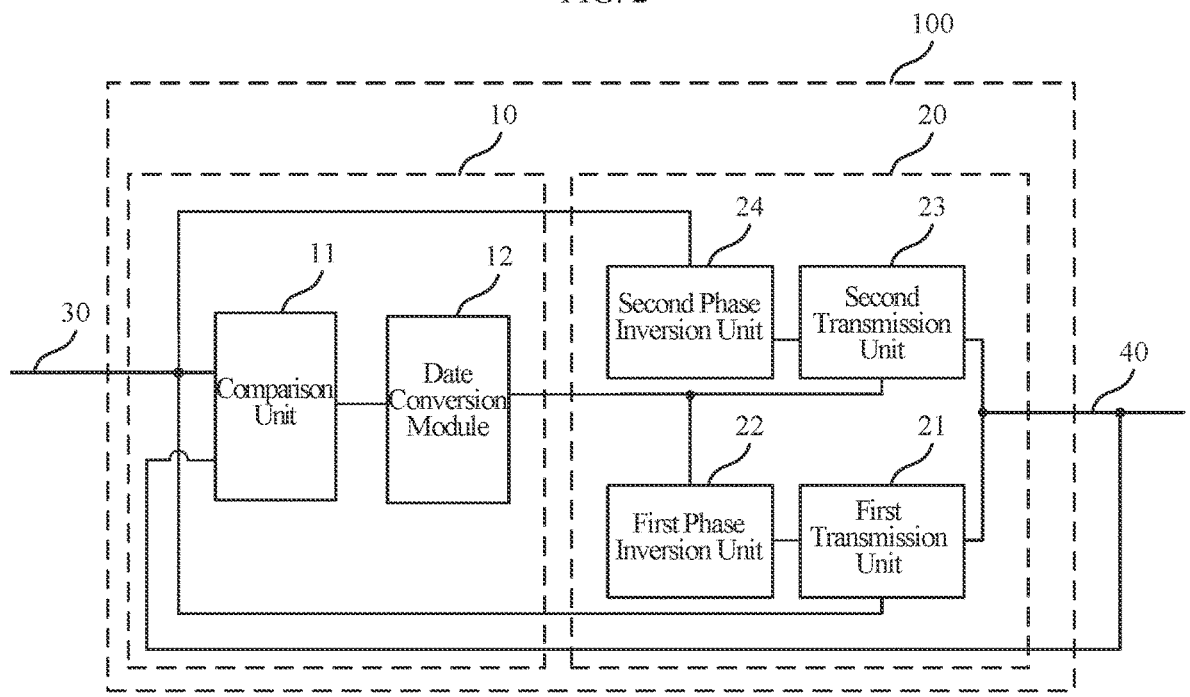
FIG. 3a is a schematic diagram showing a circuit principle of a transmission circuit according to a third embodiment of the present disclosure.
Figure 3B:
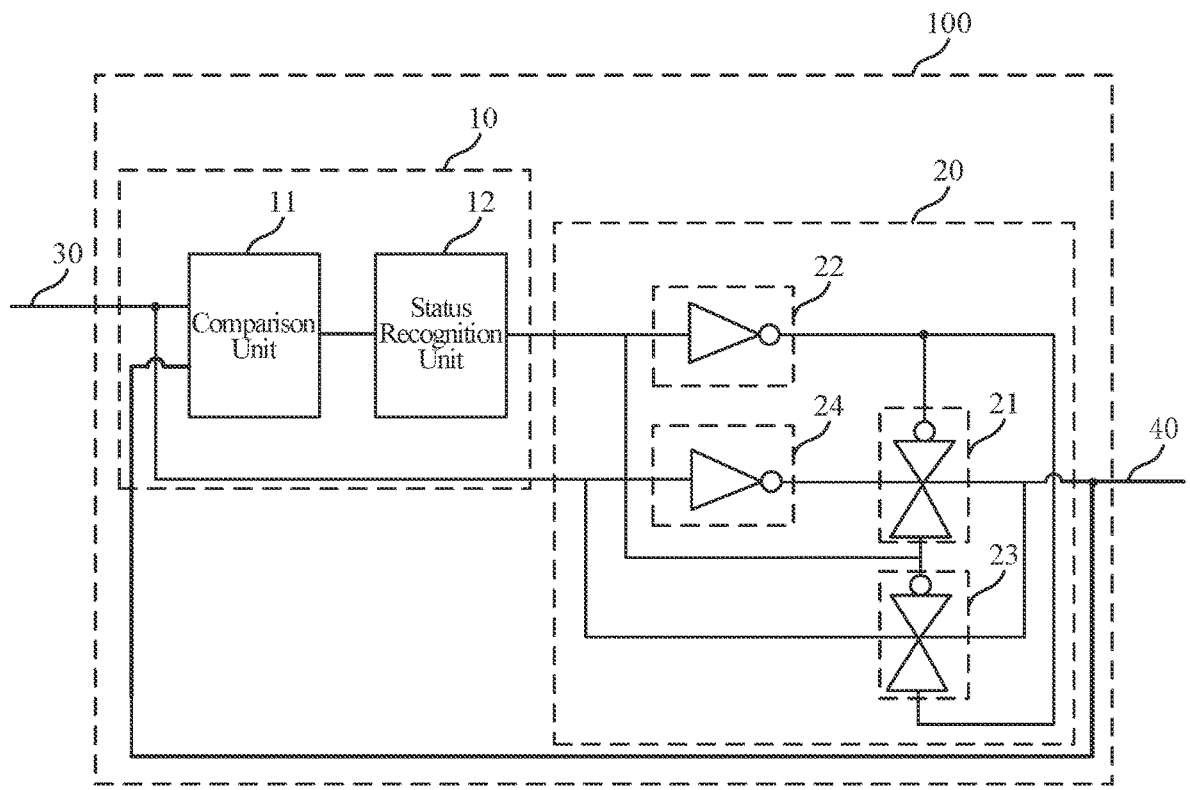

Further, with reference to FIG. 3a and FIG. 3b, in one embodiment of the present disclosure, the data conversion module 20 comprises a first transmission unit 21, a first phase inversion unit 22, a second transmission unit 23, and a second phase inversion unit 24. The first transmission unit 21 is electrically connected to the first data line 30 and the second data line 40, and is electrically connected to an output terminal of the status recognition unit 12 by means of the first phase inversion unit 22. The first transmission unit 21 transmits the first data to the second data line 40 when the comparison result outputted from the comparison unit 11 is indicative of not exceeding the preset threshold, and the preset threshold may be set as half of the preset bit width. The second transmission unit 23 is electrically connected to the second data line 40 and the output terminal of the status recognition unit 12, and is electrically connected to the first data line 30 by means of the second phase inversion unit 24.

The second transmission unit 23 transmits the inverted first data to the second data line 40 when the comparison result outputted from the comparison unit 11 is indicative of exceeding the preset threshold. In this embodiment, the number of data inversions can be reduced while ensuring the data transmission accuracy, to effectively reduce the power consumption in the data transmission process.

Figure 4:
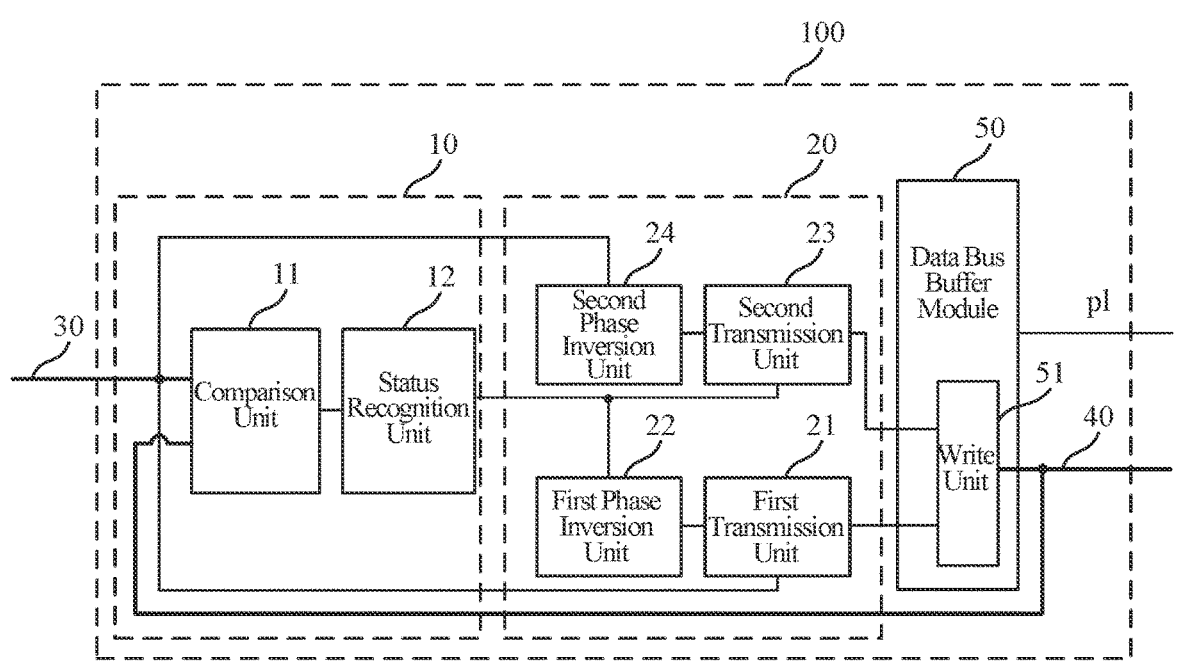
FIG. 4 is a schematic diagram showing a circuit principle of a transmission circuit according to a fourth embodiment of the present disclosure.

Further, with reference to FIG. 4, in one embodiment of the present disclosure, the data conversion module 20 is electrically connected to the second data line 40 by means of a data bus buffer module 50. The data bus buffer module 50 comprises a write unit 51, wherein the write unit 51 is configured to transmit the first data or the inverted first data to the second data line 40.

As an example, with continued reference to FIG. 4, the first data line 30 may be set as a data bus, the second data line 40 may be set as a global data line YIO, and the data bus buffer module 50 may be provided with a write unit 51. The write unit 51 transmits first data on the data bus or the inverted first data to the global data line YIO, such that the number of data inversions can be reduced while ensuring the data transmission accuracy, to effectively reduce the power consumption in the process of writing data to the global data line YIO via the data bus.

Figure 5:
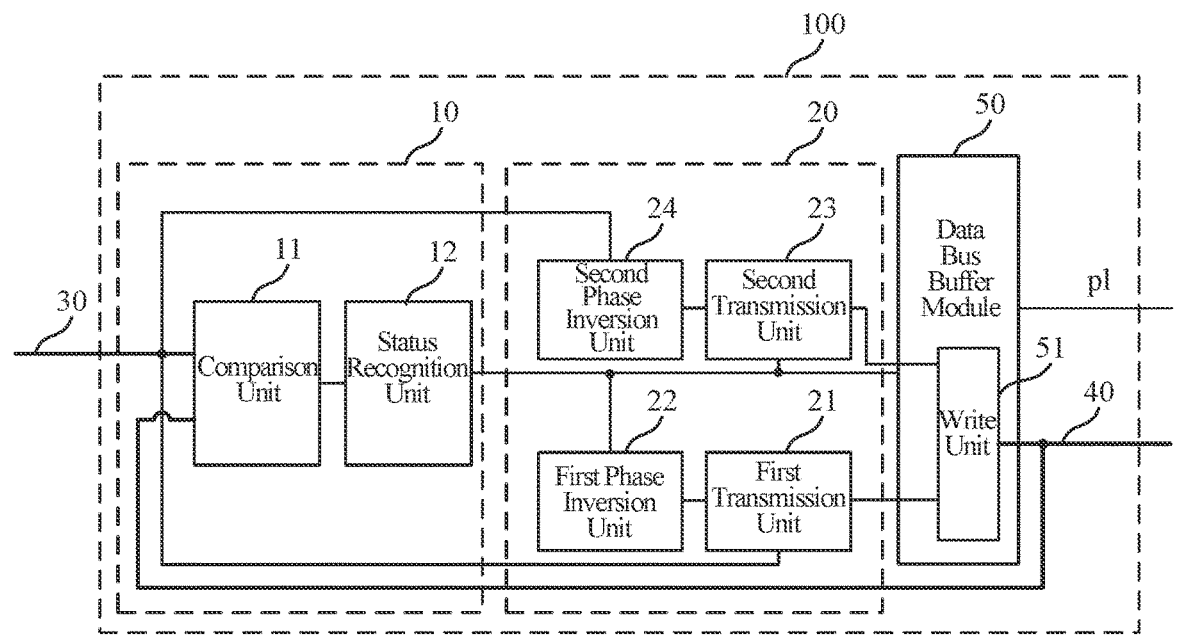
FIG. 5 is a schematic diagram showing a circuit principle of a transmission circuit according to a fifth embodiment of the present disclosure.

Further, with reference to FIG. 5, in one embodiment of the present disclosure, the data bus buffer module 50 is further electrically connected to the status recognition unit 12 and is configured to generate a data polarity identification signal pl according to an output signal from the status recognition unit 12, such that the inverted data are recovered subsequently according to the data polarity identification signal pl, to ensure the data transmission accuracy.

Figure 6:
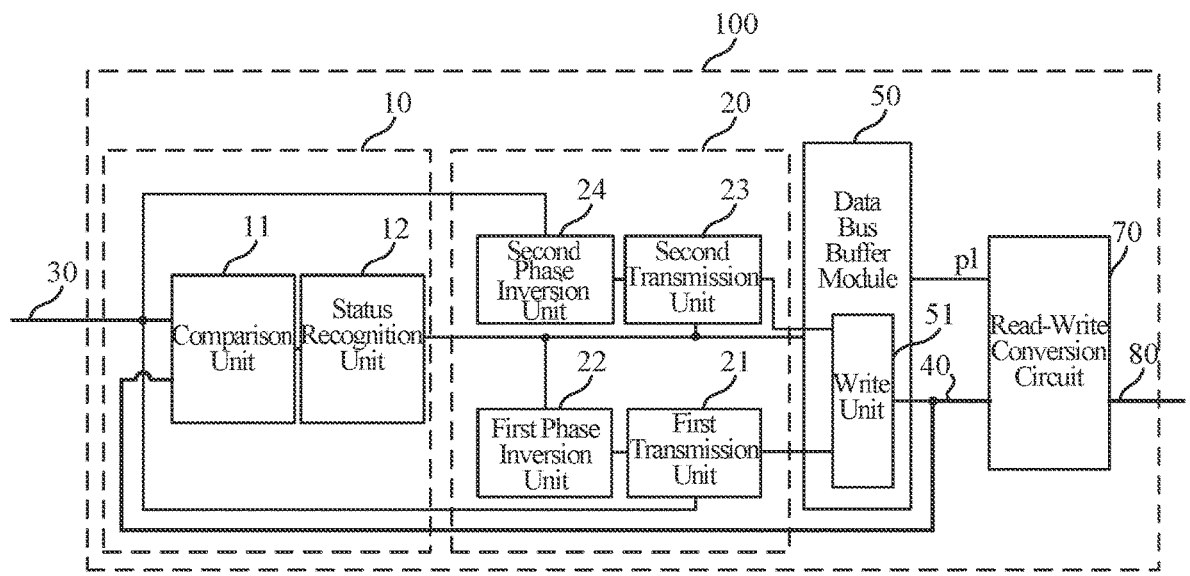
FIG. 6 is a schematic diagram showing a circuit principle of a transmission circuit according to a sixth embodiment of the present disclosure.

Further, with reference to FIG. 6, in one embodiment of the present disclosure, the transmission circuit 100 also includes a read-write conversion circuit 70. Data transmission between the second data line 40 and a third data line 80 is carried out by means of the read-write conversion circuit 70, such that transmission of read data or written data is implemented by means of the read-write conversion circuit 70.

Figure 7:
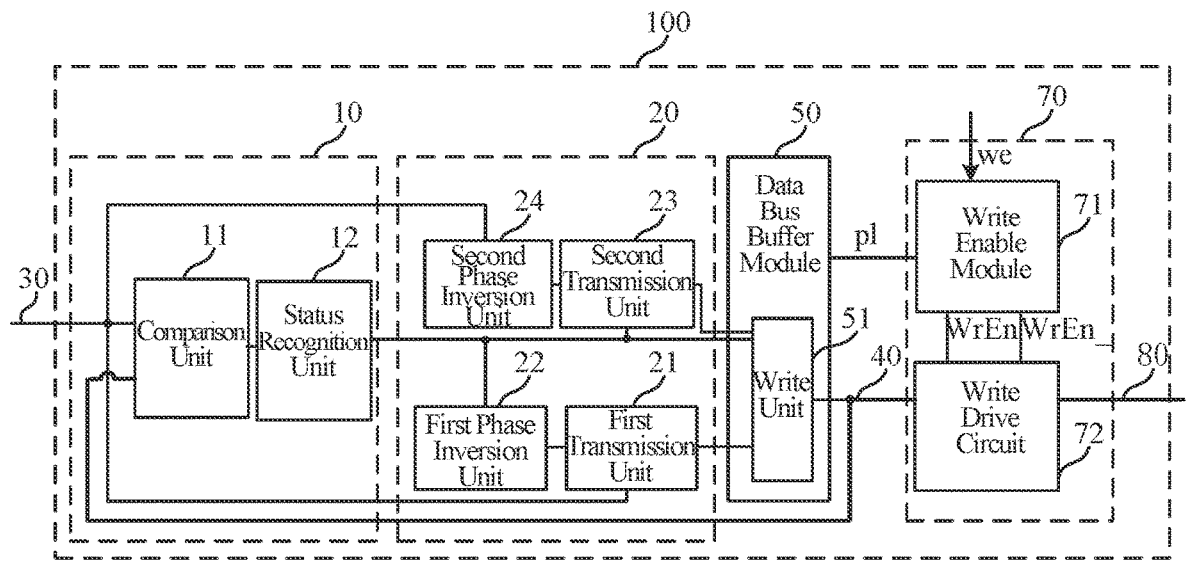
FIG. 7 is a schematic diagram showing a circuit principle of a transmission circuit according to a seventh embodiment of the present disclosure.

Further, with reference to FIG. 7, in one embodiment of the present disclosure, the second data line 40 comprises a global data line YIO and a complementary global data line YIO_, wherein the global data line YIO and the complementary global data line YIO_ are configured to transmit signals mutually inverted in phase. The third data line 80 may include a local data line LIO and a complementary local data line LIO_, wherein the local data line LIO and the complementary local data line LIO_ are configured to transmit signals mutually inverted in phase. The transmitting the inverted first data to the second data line 40 comprises:

inverting the first data and transmitting the inverted first data to the global data line YIO.

The transmitting the first data to the second data line 40 comprises:

transmitting the first data to the global data line YIO.

As an example, with continued reference to FIG. 7, the second data line 40 includes the global data line YIO and the complementary global data line YIO, wherein the global data line YIO and the complementary global data line YIO_ are configured to transmit signals mutually inverted in phase. In this way, the second transmission unit 23 inverts the first data and transmits the inverted first data to the global data line YIO when the comparison result outputted from the comparison module 10 is indicative of exceeding the preset threshold; and the first transmission unit 21 transmits the first data to the global data line YIO when the comparison result outputted from the comparison module 10 is indicative of not exceeding the preset threshold. In this embodiment, the number of data inversions can be reduced while ensuring the data transmission accuracy, to effectively reduce the power consumption in the process of writing data to the local data line LIO or the complementary local data line LIO_ via the data bus, the global data line YIO or the complementary global data line YIO.

Further, with continued reference to FIG. 7, in one embodiment of the present disclosure, the read-write conversion circuit 70 comprises a write enable module 71 and a write drive circuit 72. The write enable module 71 is configured to generate a write enable signal WrEn and a write enable inverted signal WrEn_ according to the data polarity identification signal pl and an initial write enable signal we. The write drive circuit 72 is configured to generate third data according to the write enable signal WrEn, the write enable inverted signal WrEn_, and the data on the second data line, and transmit the third data to the third data line 80, to ensure the data transmission accuracy.

Figure 8:
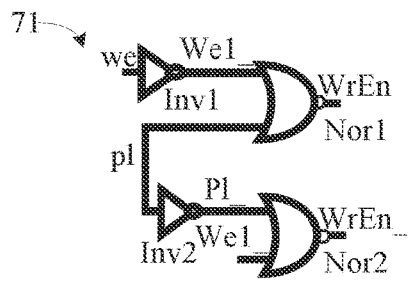
FIG. 8 is a schematic diagram showing a circuit principle of a write enable module in a transmission circuit according to an embodiment of the present disclosure.

As an example, with reference to FIG. 8, in one embodiment of the present disclosure, the write enable module 71 comprises a first inverter Inv1, a first NOR gate Nor1, a second inverter Inv2, and a second NOR gate Nor2. An input terminal of the first inverter Inv1 is electrically connected to the initial write enable signal we, and an output terminal of the first inverter Inv1 is configured to output a first write enable inverted signal We1_. An input terminal of the first NOR gate Nor1 is electrically connected to the data polarity identification signal pl and the output terminal of the first inverter Inv1, and an output terminal of the first NOR gate Nor1 is configured to output the write enable signal WrEn. An input terminal of the second inverter Inv2 is electrically connected to the data polarity identification signal pl, and an output terminal of the second inverter Inv2 is configured to output a data polarity identification inverted signal Pl_. An input terminal of the second NOR gate Nor2 is electrically connected to the output terminal of the second inverter Inv2 and the output terminal of the first inverter Inv1, and an output terminal of the second NOR gate Nor2 is configured to output the write enable inverted signal WrEn_. According to the write enable signal WrEn and the write enable inverted signal WrEn_, the write drive circuit 72 is controlled to generate third data based on the data on the second data line 40, and transmit the third data to the third data line 80 such as the local data line LIO or the complementary local data line LIO_, to ensure the data transmission accuracy.

Figure 9:
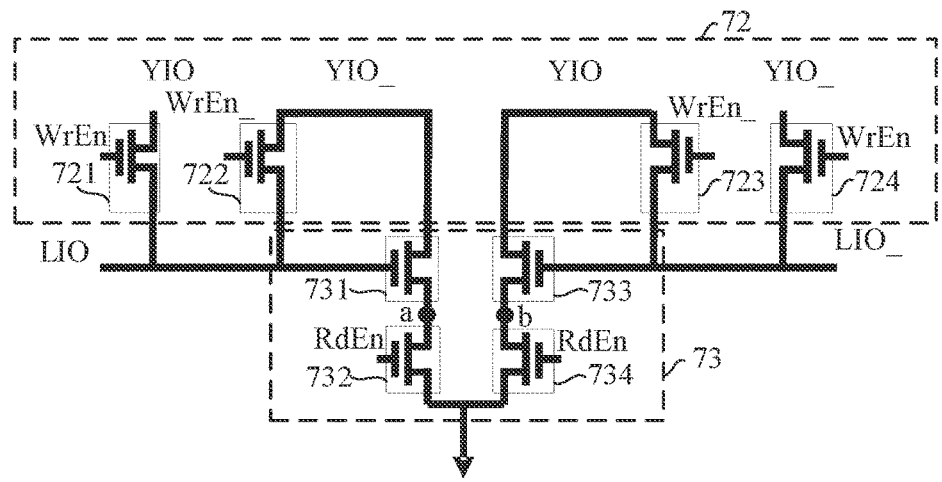
FIG. 9 is a schematic diagram of a write drive circuit in a transmission circuit according to an embodiment of the present disclosure.

As an example, with reference to FIG. 9, in one embodiment of the present disclosure, the write drive circuit 72 comprises a first switch unit 721, a second switch unit 722, a third switch unit 723, and a fourth switch unit 724. The first switch unit 721 is configured to electrically connect the local data line LIO and the global data line YIO according to the write enable signal WrEn. The second switch unit 722 is configured to electrically connect the local data line LIO and the complementary global data line YIO_ according to the write enable inverted signal WrEn_. The third switch unit 723 is configured to electrically connect the complementary local data line LIO and the global data line YIO according to the write enable inverted signal WrEn_. The fourth switch unit 724 is configured to electrically connect the complementary local data line LIO_ and the complementary global data line YIO_ according to the write enable signal WrEn. In this way, recovery of data transmission is implemented, and accuracy of data transmission is ensured.

As an example, with continued reference to FIG. 9, in one embodiment of the present disclosure, the read-write conversion circuit 70 further comprises a read drive circuit 73, wherein the read drive circuit 73 comprises a fifth switch unit 731, a sixth switch unit 732, a seventh switch unit 733, and an eighth switch unit 734. A control terminal of the fifth switch unit 731 is electrically connected to the local data line LIO, and is configured to electrically connect the complementary global data line YIO_ and a first node a according to a control terminal signal. The sixth switch unit 732 is configured to electrically connect the first node a and a ground terminal according to the read enable signal. A control terminal of the seventh switch unit 733 is electrically connected to the complementary local data line LIO_, and is configured to electrically connect the global data line YIO and a second node b according to the control terminal signal. The eighth switch unit 734 is configured to electrically connect the second node b and the ground terminal according to the read enable signal. In this embodiment, by reducing the number of data inversions in the process of data transmission, it can be effectively reduced the power consumption in the process of writing data to the local data line LIO or the complementary local data line LIO_ via the data bus, the global data line YIO or the complementary global data line YIO_.

Figure 10A:
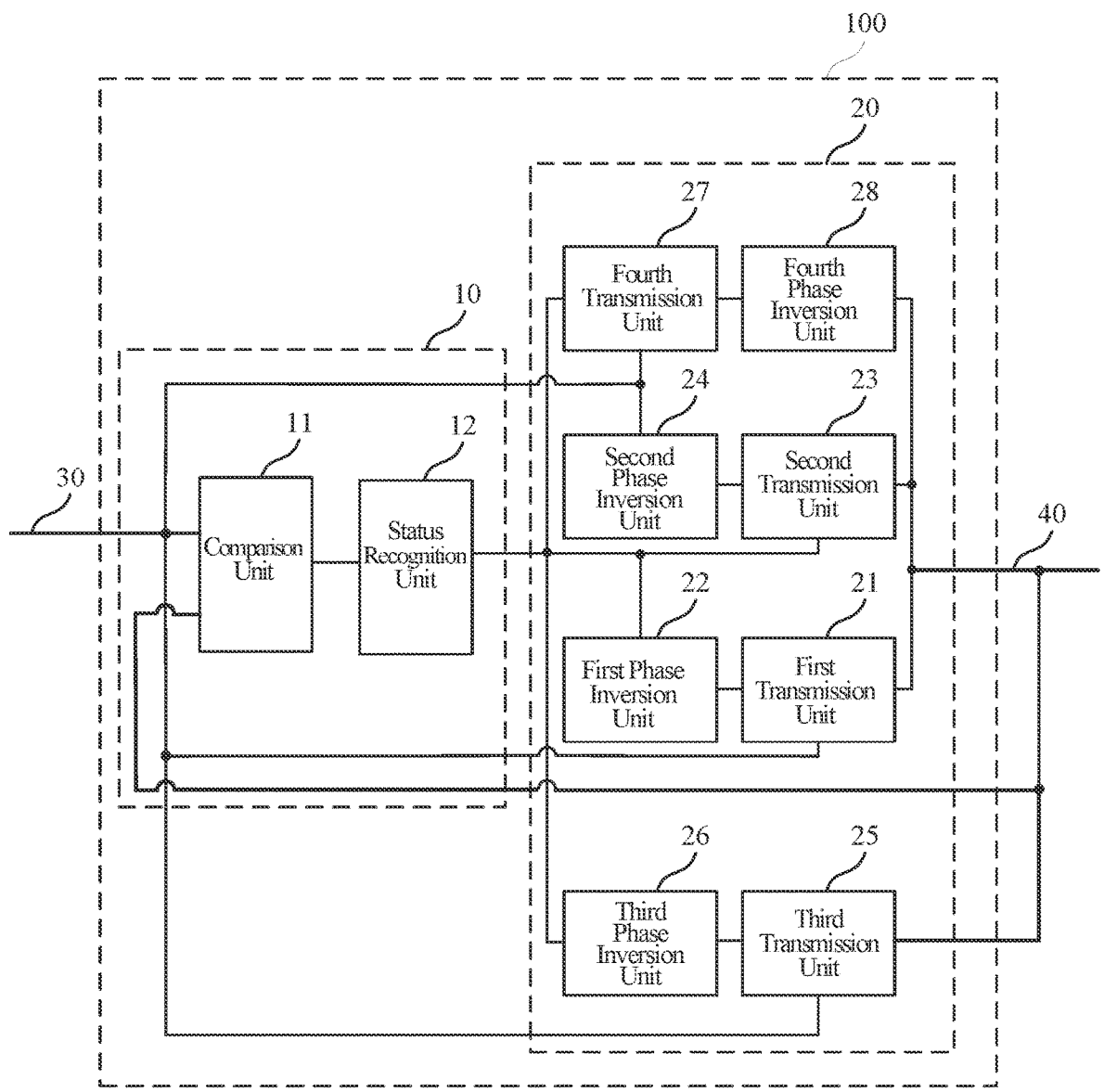
FIG. 10a is a schematic diagram showing a circuit principle of a transmission circuit according to an eighth embodiment of the present disclosure.
Figure 10B:
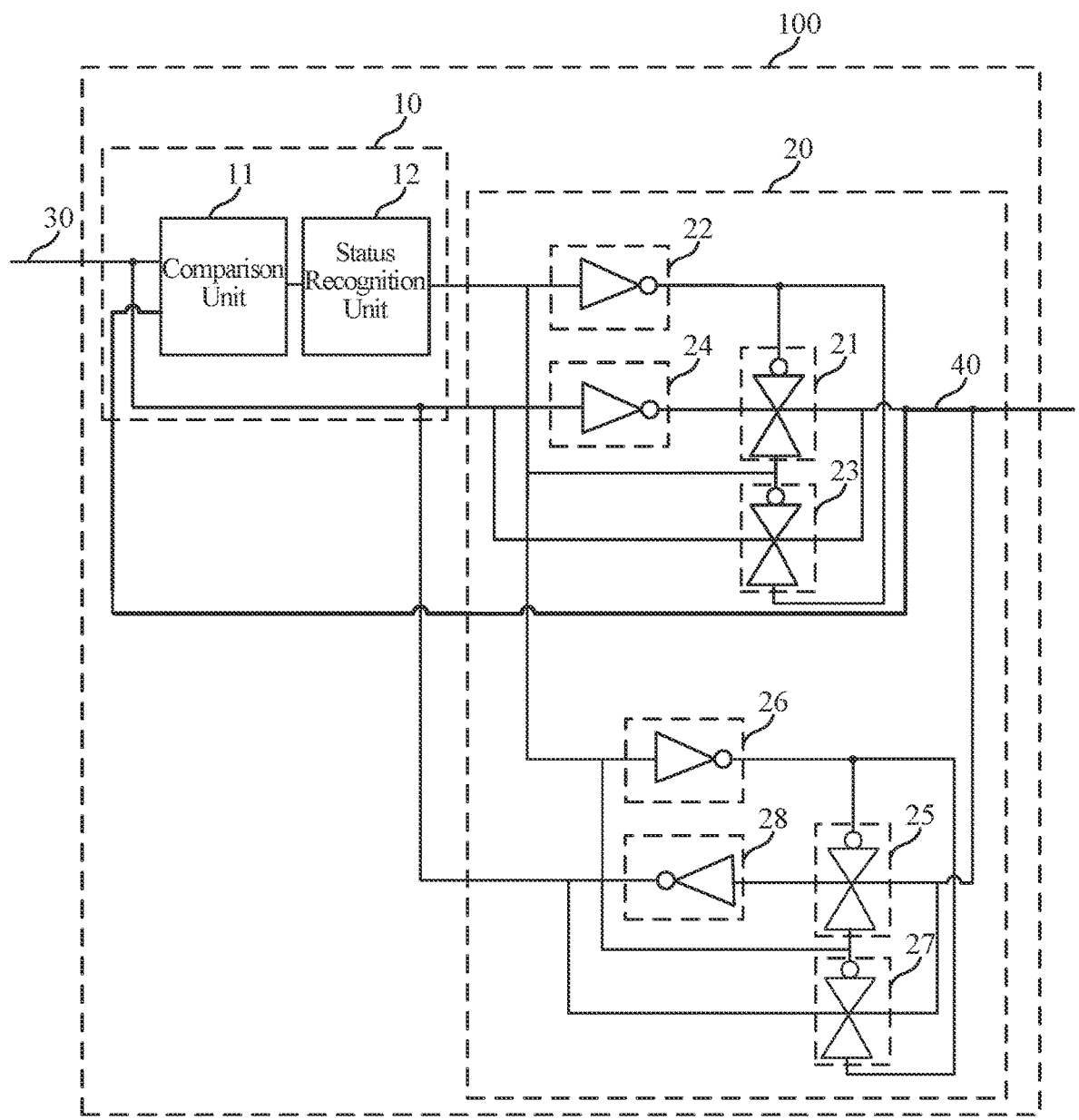

Further, with reference to FIG. 10a and FIG. 10b, in one embodiment of the present disclosure, the data conversion module 20 is also configured to invert the second data and transmit the inverted second data to the first data line 30 when the comparison result outputted from the comparison unit 11 is indicative of exceeding the preset threshold, which may be, for example, half of the preset bit width. The data conversion module 20 is also configured to transmit the second data to the first data line 30 when the comparison result is indicative of not exceeding the preset threshold. For example, the first data line 30 may be set as the data bus, and the second data line 40 may be set as the global data line YIO or the complementary global data line YIO_. In the process of reading data, when the comparison result outputted from the comparison unit 11 is indicative of exceeding the preset threshold, which may be, for example, half of the preset bit width, the data conversion module 20 inverts the second data provided by the global data line YIO or the complementary global data line YIO_, and then transmits the inverted second data to the data bus. When the comparison result outputted from the comparison unit 11 is indicative of not exceeding the preset threshold, the data conversion module 20 transmits the second data provided by the global data line YIO or the complementary global data line YIO_ to the data bus. In this way, it can be effectively reduced the power consumption in the process of transmitting the read data to the data bus via the global data line YIO or the complementary global data line YIO_.

As an example, with continued reference to FIG. 10, in one embodiment of the present disclosure, the data conversion module 20 further comprises a third transmission unit 25, a third phase inversion unit 26, a fourth transmission unit 27, and a fourth phase inversion unit 28. The third transmission unit 25 is electrically connected to the first data line 30 and the second data line 40, and is electrically connected to the output terminal of the status recognition unit 12 by means of the third phase inversion unit 26. The third transmission unit 25 is configured to transmit the second data to the first data line 30 when the comparison result outputted from the comparison module 10 is indicative of not exceeding the preset threshold. The fourth transmission unit 27 is electrically connected to the first data line 30 and the output terminal of the status recognition unit 12, and is electrically connected to the second data line 40 by means of the fourth phase inversion unit 28. The fourth transmission unit 27 is configured to invert the second data and transmit the inverted second data to the first data line 30 when the comparison result is indicative of exceeding the preset threshold.

Figure 11:
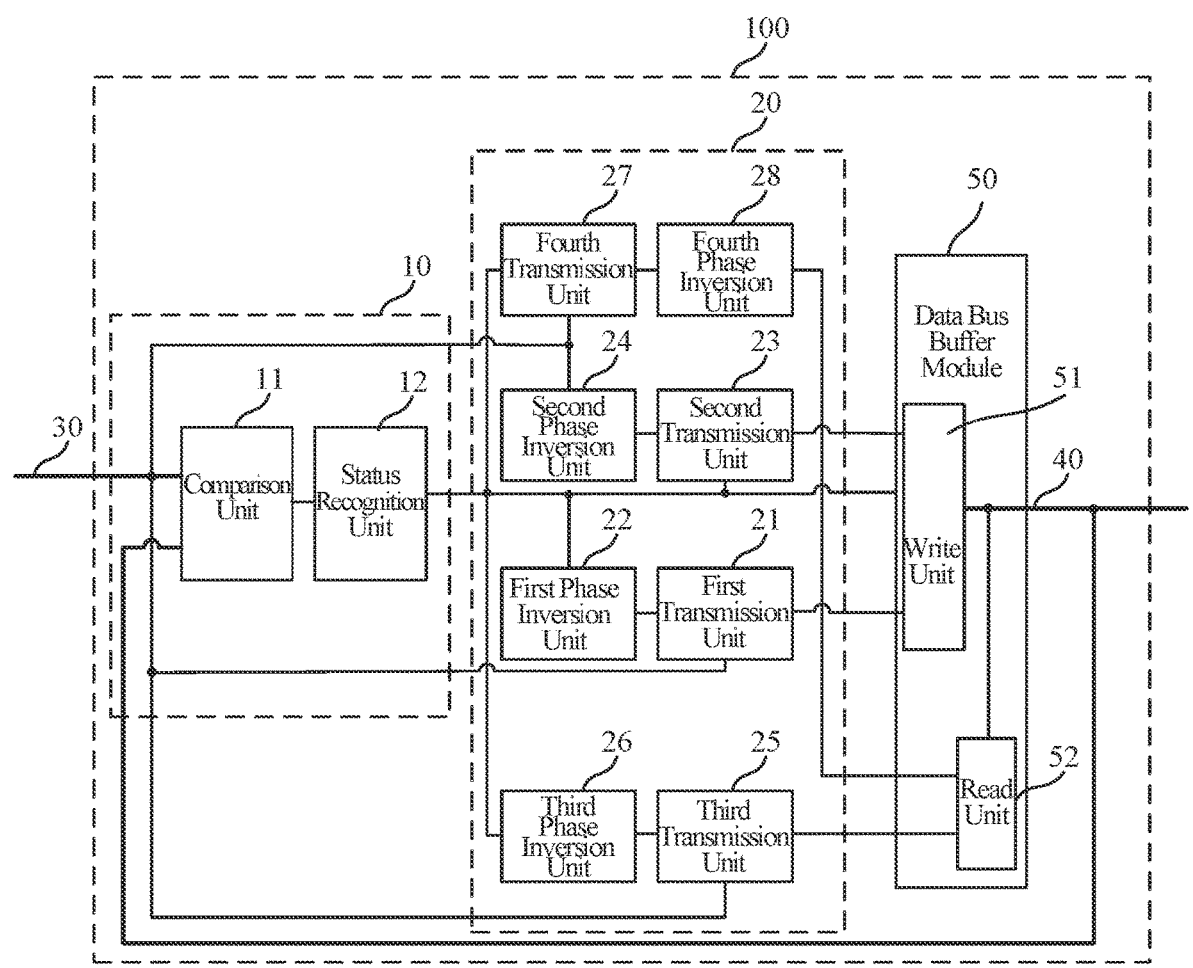
FIG. 11 is a schematic diagram showing a circuit principle of a transmission circuit according to a ninth embodiment of the present disclosure.

Further, with reference to FIG. 11, in one embodiment of the present disclosure, the data bus buffer module 50 also comprises a read unit 52. The read unit 52 is configured to transmit the second data to the third transmission unit 25, or invert the second data by means of the fourth phase inversion unit 28 and then transmit the inverted second data to the fourth transmission unit 27. For example, the first data line 30 may be set as the data bus, and the second data line 40 may be set as the global data line YIO or the complementary global data line YIO_. In the process of reading data, when the comparison result outputted from the comparison unit 11 is indicative of exceeding the preset threshold, which may be, for example, half of the preset bit width, the fourth transmission unit 27 inverts the second data provided by the global data line YIO or the complementary global data line YIO_, and then transmits the inverted second data to the data bus. When the comparison result outputted from the comparison unit 11 is indicative of not exceeding the preset threshold, the third transmission unit 25 transmits the second data provided by the global data line YIO or the complementary global data line YIO_ to the data bus. In this way, it can be effectively reduced the power consumption in the process of transmitting the read data to the data bus via the global data line YIO or the complementary global data line YIO_.

Figure 12:
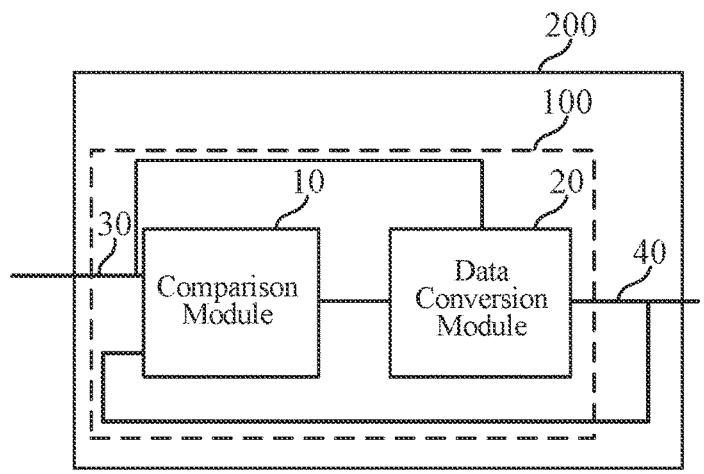
FIG. 12 is a structural block diagram of a storage apparatus according to an embodiment of the present disclosure.

Further, with reference to FIG. 12, in one embodiment of the present disclosure, there is provided a storage apparatus 200, which comprises the transmission circuit 100 according to any one of the above embodiments of the present disclosure, wherein the storage apparatus 200 is configured to store and transmit data of a read operation or a write operation.

Reference may be made to limitations on the transmission circuit 100 hereinabove for limitations on the storage apparatus 200 in the foregoing embodiment, and thus detailed description of the limitations on the storage apparatus 200 is omitted herein.

Figure 13:
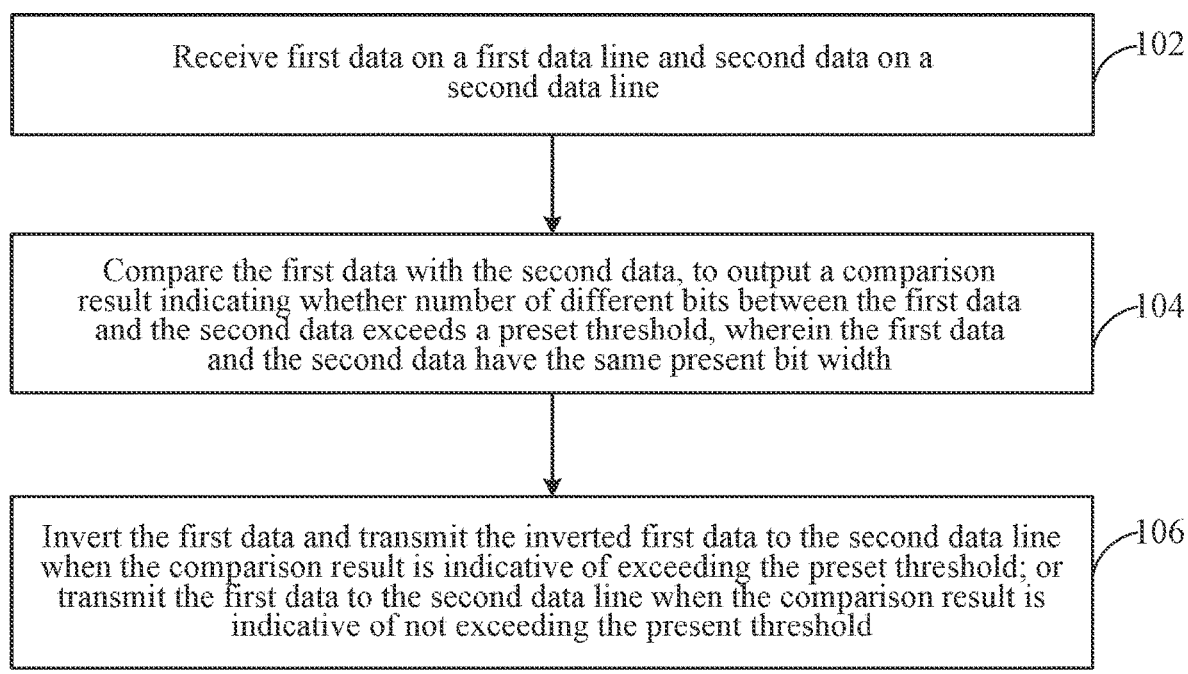
FIG. 13 is a schematic flow diagram of a transmission method according to an embodiment of the present disclosure.

Further, with reference to FIG. 13, in one embodiment of the present disclosure, there is provided a transmission method, comprising:

Step 102: receiving first data on a first data line and second data on a second data line;

Step 104: comparing the first data with the second data, to output a comparison result indicating whether number of different bits between the first data and the second data exceeds a preset threshold, wherein the first data and the second data have the same preset bit width; and Step 106: inverting the first data and transmitting the inverted first data to the second data line when the comparison result is indicative of exceeding the preset threshold; or transmitting the first data to the second data line when the comparison result is indicative of not exceeding the preset threshold.

In some embodiments, with continued reference to FIG. 13, the first data on the first data line are compared with the second data on the second data line, to output a comparison result indicating whether number of different bits between the first data and the second data exceeds a preset threshold, wherein the first data and the second data have the same preset bit width. The first data are inverted and then the inverted first data are transmitted to the second data line when the comparison result is indicative of exceeding the preset threshold. The first data are transmitted to the second data line when the comparison result is indicative of not exceeding the preset threshold. The transmitted data generally include a data string comprising 0 and 1, by applying a power saving algorithm into the data transmission process, the number of data inversions can be reduced while ensuring the data transmission accuracy, to effectively reduce the power consumption in the data transmission process. In this way, the power consumption of a data transmission path in a storage array region can be effectively reduced while ensuring density and number of memory cells in a memory cell array.

As an example, in one embodiment of the present disclosure, the second data line comprises a global data line and a complementary global data line, wherein the global data line and the complementary global data line are configured to transmit signals mutually inverted in phase.

The inverting the first data and transmitting the inverted first data to the second data line comprise:

inverting the first data and transmitting the inverted first data to the global data line YIO.

The transmitting the first data to the second data line comprises:

transmitting the first data to the global data line YIO.

Figure 14:
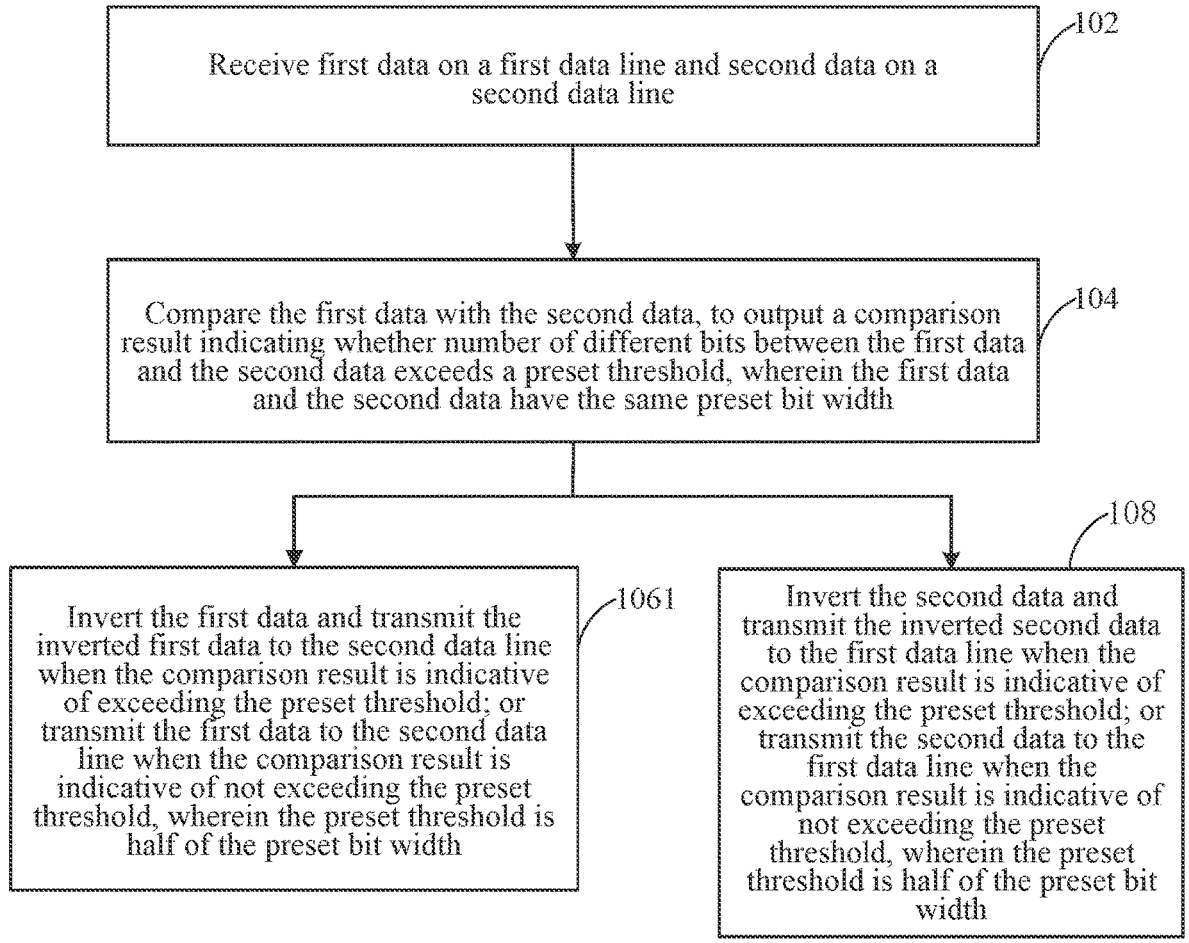
FIG. 14 is a schematic flow diagram of a transmission method according to another embodiment of the present disclosure.

Further, with reference to FIG. 14, in one embodiment of the present disclosure, the method includes:

Step 102: receiving first data on a first data line and second data on a second data line;

Step 104: comparing the first data with the second data, to output a comparison result indicating whether number of different bits between the first data and the second data exceeds a preset threshold, wherein the first data and the second data have the same preset bit width;

Step 1061: inverting the first data and transmitting the inverted first data to the second data line when the comparison result is indicative of exceeding the preset threshold; or transmitting the first data to the second data line when the comparison result is indicative of not exceeding the preset threshold, wherein the preset threshold is half of the preset bit width; and Step 108: inverting the second data and transmitting the inverted second data to the first data line when the comparison result is indicative of exceeding the preset threshold; or transmitting the second data to the first data line when the comparison result is indicative of not exceeding the preset threshold, wherein the preset threshold is half of the preset bit width.

As an example, with continued reference to FIG. 11 and FIG. 14, the first data line 30 may be set as the data bus, and the second data line 40 may be set to include the global data line YIO and the complementary global data line YIO_. In the process of writing data, the second transmission unit 23 inverts the first data and transmits the inverted first data to the global data line YIO when the comparison result outputted from the comparison module 10 is indicative of exceeding the preset threshold, which may be, for example, half of the preset bit width. The first transmission unit 21 transmits the first data to the global data line YIO when the comparison result outputted from the comparison module 10 is indicative of not exceeding the preset threshold. In this way, it can be effectively reduced the power consumption in the process of transmitting the written data to the global data line YIO via the data bus. In the process of reading data, when the comparison result outputted from the comparison unit 11 is indicative of exceeding the preset threshold, the fourth transmission unit 27 inverts the second data provided by the complementary global data line YIO_, and then transmits the inverted second data to the data bus. When the comparison result outputted from the comparison unit 11 is indicative of not exceeding the preset threshold, the third transmission unit 25 transmits the second data provided by the complementary global data line YIO_ to the data bus. In this way, it can be effectively reduced the power consumption in the process of transmitting the read data to the data bus via the complementary global data line YIO_.

In one embodiment of the present disclosure, there is provided a computer-readable storage medium, storing a computer program thereon. The computer program is executable by a processor, whereby the transmission method according to any one of the above embodiments of the present disclosure is implemented.

In the computer-readable storage medium of the foregoing embodiment, the first data on the first data line are compared with the second data on the second data line, to output a comparison result indicating whether number of different bits between the first data and the second data exceeds a preset threshold, wherein the first data and the second data have the same preset bit width. The first data are inverted and then the inverted first data are transmitted to the second data line when the comparison result is indicative of exceeding the preset threshold. The first data are transmitted to the second data line when the comparison result is indicative of not exceeding the preset threshold. The transmitted data generally include a data string comprising 0 and 1, by applying a power saving algorithm into the data transmission process, the number of data inversions can be reduced while ensuring the data transmission accuracy, to effectively reduce the power consumption in the data transmission process. In this way, the power consumption of a data transmission path in a storage array region can be effectively reduced while ensuring density and number of memory cells in a memory cell array.

It should be understood that although the various steps in the flowcharts of FIG. 13 and FIG. 14 are displayed in sequence as indicated by the arrows, these steps are not necessarily performed in sequence in the order indicated by the arrows. It should be understood that unless expressly stated herein, the execution of these steps is not strictly limited in sequence, and these steps may be performed in other orders. Moreover, at least some of the steps in FIG. 13 and FIG. 14 may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

Those of ordinary skill in the art may understand that implementation of all or some flows in the method according to the foregoing embodiments may be achieved by instructing relevant hardware by a computer program, wherein the computer program may be stored in a non-transitory computer-readable storage medium, and when the computer program is executed, the flows of the embodiments of the foregoing methods may be included. Any reference to memory, storage, database or other media used in the embodiments provided in the present disclosure may include nonvolatile and/or volatile memory. The nonvolatile memory may include a read-only memory (ROM), a programmable ROM (PROM), an electrically programmable read-only memory ROM (EPROM), an electrically erasable programmable ROM (EEPROM) or a flash memory. The volatile memory may include a random access memory (RAM) or an external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronization link (Synchlink) DRAM (SLDRAM), direct Rambus dynamic RAM (DRDRAM), and Rambus dynamic RAM (RDRAM), etc.

It is to be noted that the above embodiments are intended for purposes of illustration only and are not intended to limit the present disclosure.

Technical features of the above embodiments may be appropriately combined. For brevity of description, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A transmission circuit, comprising:
a comparison module, configured to receive first data on a first data line and second data on a second data line, and compare the first data with the second data to output a comparison result indicating whether number of different bits between the first data and the second data exceeds a preset threshold, wherein the first data and the second data have a same preset bit width; and
a data conversion module electrically connected to the first data line, the comparison module, and the second data line, the data conversion module being configured to invert the first data and transmit the inverted first data to the second data line when the comparison result is indicative of exceeding the preset threshold; and the data conversion module being further configured to transmit the first data to the second data line when the comparison result is indicative of not exceeding the preset threshold.

2. The transmission circuit according to claim 1, wherein the comparison module comprises:
a comparison unit configured to compare the first data and the second data bit by bit, and output comparison status data of each bit; and
a status recognition unit electrically connected to the comparison unit, the status recognition unit being configured to perform statistics on the comparison status data of each bit, and output the comparison result according to a statistical result.

3. The transmission circuit according to claim 2, wherein the data conversion module comprises:
a first transmission unit electrically connected to the first data line and the second data line and electrically connected to an output terminal of the status recognition unit by means of a first phase inversion unit, the first transmission unit being configured to transmit the first data to the second data line when the comparison result is indicative of not exceeding the preset threshold, the preset threshold being half of the preset bit width; and
a second transmission unit electrically connected to the second data line and the output terminal of the status recognition unit and electrically connected to the first data line by means of a second phase inversion unit, the second transmission unit being configured to transmit the inverted first data to the second data line when the comparison result is indicative of exceeding the preset threshold.

4. The transmission circuit according to claim 2, wherein the data conversion module is electrically connected to the second data line by means of a data bus buffer module; and
the data bus buffer module comprises a write unit, the write unit being configured to transmit the first data or the inverted first data to the second data line.

5. The transmission circuit according to claim 4, wherein the data bus buffer module is further electrically connected to the status recognition unit and is configured to generate a data polarity identification signal according to the comparison result.

6. The transmission circuit according to claim 5, further comprising a read-write conversion circuit, wherein the read-write conversion circuit is configured to generate third data according to the data polarity identification signal and the data on the second data line, and transmit the third data to a third data line.

7. The transmission circuit according to claim 6, wherein the second data line comprises a global data line and a complementary global data line, the global data line and the complementary global data line being configured to transmit signals mutually inverted in phase;
the inverting the first data and transmitting the inverted first data to the second data line comprises:
inverting the first data and transmitting the inverted first data to the global data line;
the transmitting the first data to the second data line comprises:
transmitting the first data to the global data line.

8. The transmission circuit according to claim 7, wherein the read-write conversion circuit comprises:
a write enable module, configured to generate a write enable signal and a write enable inverted signal according to the data polarity identification signal and an initial write enable signal; and
a write drive circuit, configured to generate the third data according to the write enable signal, the write enable inverted signal, and the data on the second data line.

9. The transmission circuit according to claim 8, wherein the write enable module comprises:
a first inverter, an input terminal of the first inverter being electrically connected to the initial write enable signal, and an output terminal of the first inverter being configured to output a first write enable inverted signal;
a first NOR gate, an input terminal of the first NOR gate being electrically connected to the data polarity identification signal and the output terminal of the first inverter, and an output terminal of the first NOR gate being configured to output a write enable signal;
a second inverter, an input terminal of the second inverter being electrically connected to the data polarity identification signal, and an output terminal of the second inverter being configured to output a data polarity identification inverted signal; and
a second NOR gate, an input terminal of the second NOR gate being electrically connected to the output terminal of the second inverter and the output terminal of the first inverter, and an output terminal of the second NOR gate being configured to output the write enable inverted signal.

10. The transmission circuit according to claim 9, wherein the third data line comprises a local data line and a complementary local data line.

11. The transmission circuit according to claim 10, wherein the write drive circuit comprises:
a first switch unit, configured to electrically connect the local data line and the global data line according to the write enable signal;
a second switch unit, configured to electrically connect the local data line and the complementary global data line according to the write enable inverted signal;
a third switch unit, configured to electrically connect the complementary local data line and the global data line according to the write enable inverted signal; and
a fourth switch unit, configured to electrically connect the complementary local data line and the complementary global data line according to the write enable signal.

12. The transmission circuit according to claim 11, wherein the read-write conversion circuit further comprises a read drive circuit, the read drive circuit comprising:
a fifth switch unit, a control terminal of the fifth switch unit being electrically connected to the local data line, the fifth switch unit being configured to electrically connect the complementary global data line and a first node according to a control terminal signal;
a sixth switch unit, configured to electrically connect the first node and a ground terminal according to the read enable signal;
a seventh switch unit, a control terminal of the seventh switch unit being electrically connected to the complementary local data line, the seventh switch unit being configured to electrically connect the global data line and a second node according to the control terminal signal; and
an eighth switch unit, configured to electrically connect the second node and the ground terminal according to the read enable signal.

13. The transmission circuit according to claim 4, wherein the data conversion module is further configured to invert the second data and transmit the inverted second data to the first data line when the comparison result is indicative of exceeding the preset threshold; and
the data conversion module is further configured to transmit the second data to the first data line when the comparison result is indicative of not exceeding the preset threshold.

14. The transmission circuit according to claim 13, wherein the data conversion module further comprises:
a third transmission unit, electrically connected to the first data line and the second data line and electrically connected to the output terminal of the status recognition unit by means of a third phase inversion unit, the third transmission unit being configured to transmit the second data to the first data line when the comparison result is indicative of not exceeding the preset threshold; and
a fourth transmission unit, electrically connected to the first data line and the output terminal of the status recognition unit and electrically connected to the second data line by means of a fourth phase inversion unit, the fourth transmission unit being configured to invert the second data and transmit the inverted second data to the first data line when the comparison result is indicative of exceeding the preset threshold.

15. The transmission circuit according to claim 14, wherein the data bus buffer module further comprises:
a read unit, configured to transmit the second data to the third transmission unit, or invert the second data by means of the fourth phase inversion unit and transmit the inverted second data to the fourth transmission unit.

16. A storage apparatus comprising a transmission circuit, the storage apparatus being configured to store and transmit data of a read operation or a write operation;
wherein the transmission circuit comprises:
a comparison module, configured to receive first data on a first data line and second data on a second data line, and compare the first data with the second data to output a comparison result indicating whether number of different bits between the first data and the second data exceeds a preset threshold, wherein the first data and the second data have a same preset bit width; and
a data conversion module electrically connected to the first data line, the comparison module, and the second data line, the data conversion module being configured to invert the first data and transmit the inverted first data to the second data line when the comparison result is indicative of exceeding the preset threshold; and the data conversion module being further configured to transmit the first data to the second data line when the comparison result is indicative of not exceeding the preset threshold.

17. A transmission method, comprising:
receiving first data on a first data line and second data on a second data line;
comparing the first data with the second data, to output a comparison result indicating whether number of different bits between the first data and the second data exceeds a preset threshold, wherein the first data and the second data have a same preset bit width; and
inverting the first data and transmitting the inverted first data to the second data line when the comparison result is indicative of exceeding the preset threshold; or transmitting the first data to the second data line when the comparison result is indicative of not exceeding the preset threshold.

18. The transmission method according to claim 17, wherein the second data line comprises a global data line and a complementary global data line, the global data line and the complementary global data line being configured to transmit signals mutually inverted in phase;
the inverting the first data and transmitting the inverted first data to the second data line comprises:
inverting the first data and transmitting the inverted first data to the global data line;
the transmitting the first data to the second data line comprises:
transmitting the first data to the global data line.

19. The transmission method according to claim 17, wherein the preset threshold is half of the preset bit width, the method further comprising:
inverting the second data and transmitting the inverted second data to the first data line when the comparison result is indicative of exceeding the preset threshold; or transmitting the second data to the first data line when the comparison result is indicative of not exceeding the preset threshold.

20. A computer-readable storage medium storing a computer program, the computer program is executable by a processor to implement a transmission method, wherein the transmission method comprises:
- receiving first data on a first data line and second data on a second data line;
- comparing the first data with the second data, to output a comparison result indicating whether number of different bits between the first data and the second data exceeds a preset threshold, wherein the first data and the second data have a same preset bit width; and
- inverting the first data and transmitting the inverted first data to the second data line when the comparison result is indicative of exceeding the preset threshold; or transmitting the first data to the second data line when the comparison result is indicative of not exceeding the preset threshold.

* * * * *